United States Patent
Katayama et al.

(10) Patent No.: US 8,034,889 B2
(45) Date of Patent: Oct. 11, 2011

(54) RESIN FOR OPTICAL-SEMICONDUCTOR-ELEMENT ENCAPSULATION AND OPTICAL SEMICONDUCTOR DEVICE OBTAINED WITH THE SAME

(75) Inventors: Hiroyuki Katayama, Ibaraki (JP); Asami Kubo, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 249 days.

(21) Appl. No.: 12/277,930

(22) Filed: Nov. 25, 2008

(65) Prior Publication Data

US 2009/0134426 A1   May 28, 2009

(30) Foreign Application Priority Data

Nov. 28, 2007   (JP) .................. 2007-306817

(51) Int. Cl.
   *C08G 77/00*   (2006.01)
   *H01J 1/62*   (2006.01)
(52) U.S. Cl. .............. 528/10; 257/100; 257/E33.059; 528/24; 528/25
(58) Field of Classification Search ............ 528/10, 528/24, 25; 527/100, E33.059
   See application file for complete search history.

(56) References Cited

U.S. PATENT DOCUMENTS

| | | |
|---|---|---|
| 3,413,242 A | 11/1968 | Roberts et al. |
| 5,614,654 A | 3/1997 | Miyake et al. |
| 2003/0216537 A1 | 11/2003 | Friedrich |
| 2006/0035092 A1 | 2/2006 | Shimizu et al. |
| 2006/0270786 A1 | 11/2006 | Shimizu |

FOREIGN PATENT DOCUMENTS

| | | |
|---|---|---|
| DE | 2719091 A1 | 1/1978 |
| DE | 3920297 A1 | 1/1991 |
| EP | 0263428 A2 | 4/1988 |
| EP | 0358011 A2 | 3/1990 |
| EP | 0947520 A1 | 10/1999 |
| EP | 1130053 A2 | 9/2001 |
| EP | 1684363 A2 | 7/2006 |
| GB | 1479475 A | 7/1977 |
| JP | 8-120084 A | 5/1996 |
| JP | 8-268735 A | 10/1996 |
| JP | 08268735 | * 10/1996 |
| JP | 9-48787 A | 2/1997 |
| JP | 10-95852 A | 4/1998 |
| JP | 11-246661 A | 9/1999 |
| JP | 2003-165841 A | 6/2003 |
| JP | 2006-77234 A | 3/2006 |
| JP | 2006-274249 A | 10/2006 |
| JP | 2006-328315 A | 12/2006 |
| JP | 2008-231403 A | 10/2008 |

OTHER PUBLICATIONS

Notice of Reasons for Rejection dated Apr. 23, 2010, issued in counterpart Japanese Application No. 2007-306817.
Extended European Search Report dated Mar. 23, 2009.
Office Action issued on Apr. 20, 2011 in the corresponding European Patent Application No. 08020392.0.
Korean Office Action issued on Jul. 26, 2011 in the corresponding Korean Patent Application No. 10-2008-118802.

* cited by examiner

*Primary Examiner* — Ling Choi
*Assistant Examiner* — Chun-Cheng Wang
(74) *Attorney, Agent, or Firm* — Sughrue Mion, PLLC

(57) ABSTRACT

The present invention relates to a resin for optical-semiconductor-element encapsulation obtained by reacting a silicon compound with a boron compound or an aluminum compound, wherein the silicon compound is represented by the following formula (I):

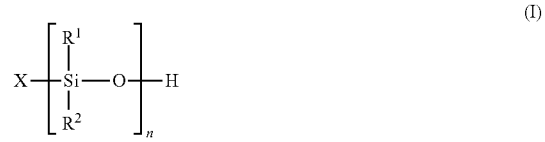

wherein $R^1$ and $R^2$ each independently represent an alkyl group, a cycloalkyl group, an alkenyl group, an alkynyl group, or an aryl group, in which a plurality of $R^1$'s are the same or different and a plurality of $R^2$'s are the same or different; X represents a hydroxy group, an alkoxy group, an alkyl group, a cycloalkyl group, an alkenyl group, an alkynyl group, or an aryl group; and n is 4 to 250, and an optical semiconductor device obtained with the resin.

10 Claims, No Drawings

RESIN FOR OPTICAL-SEMICONDUCTOR-ELEMENT ENCAPSULATION AND OPTICAL SEMICONDUCTOR DEVICE OBTAINED WITH THE SAME

FIELD OF THE INVENTION

The present invention relates to a resin for optical-semiconductor-element encapsulation and an optical semiconductor device obtained with the resin.

BACKGROUND OF THE INVENTION

Resin compositions for optical-semiconductor-element encapsulation, which are used for encapsulating optical semiconductor elements such as light-emitting diodes (LEDs), are required to give a cured resin having transparency. In general, epoxy resin compositions obtained from an epoxy resin, such as a bisphenol A epoxy resin or an alicyclic epoxy resin, and an acid anhydride hardener have been commonly used (see, for example, JP-A-2006-274249).

However, there are cases where the epoxy resins discolor when used over long at high temperatures, resulting in a decrease in luminance of the light-emitting diode devices. Encapsulating resins are required to have a modulus of elasticity reduced to some degree in order to stably produce the resins in a sheet form by a roll-to-roll process or to relieve the stress to be imposed on the optical semiconductor devices obtained by encapsulation with the resins. However, epoxy resins generally have a high modulus of elasticity and are hence unsuitable for that purpose.

SUMMARY OF THE INVENTION

An object of the invention is to provide a resin for optical-semiconductor-element encapsulation which suffers no discoloration when used at a high temperature, has a satisfactory light transmittance, and has a satisfactory storage modulus, i.e., has flexibility which makes the resin producible by a roll-to-roll process. Another object of the invention is to provide an optical semiconductor device which includes an optical semiconductor element encapsulated with the resin and has a satisfactory luminance retention.

Namely, the invention provides the following items 1 to 9.

1. A resin for optical-semiconductor-element encapsulation obtained by reacting a silicon compound with a boron compound or an aluminum compound, wherein the silicon compound is represented by the following formula (I):

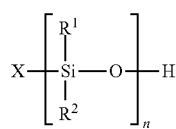

(I)

wherein $R^1$ and $R^2$ each independently represent an alkyl group, a cycloalkyl group, an alkenyl group, an alkynyl group, or an aryl group, in which a plurality of $R^1$'s are the same or different and a plurality of $R^2$'s are the same or different; X represents a hydroxy group, an alkoxy group, an alkyl group, a cycloalkyl group, an alkenyl group, an alkynyl group, or an aryl group; and n is 4 to 250.

2. The resin for optical-semiconductor-element encapsulation according to item 1, wherein the boron compound is represented by the following formula (II):

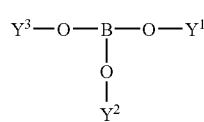

(II)

wherein $Y^1$, $Y^2$, and $Y^3$ each independently represent hydrogen or an alkyl group.

3. The resin for optical-semiconductor-element encapsulation according to item 1, wherein the aluminum compound is represented by the following formula (III):

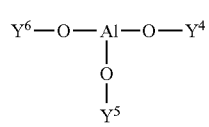

(III)

wherein $Y^4$, $Y^5$, and $Y^6$ each independently represent hydrogen or an alkyl group.

4. The resin for optical-semiconductor-element encapsulation according to item 1, wherein $R^1$ and $R^2$ each are methyl and X is hydroxy.

5. The resin for optical-semiconductor-element encapsulation according to item 2, wherein the boron compound is triisopropyl borate.

6. The resin for optical-semiconductor-element encapsulation according to item 3, wherein the aluminum compound is aluminum triisopropoxide.

7. The resin for optical-semiconductor-element encapsulation according to item 1, which has a storage modulus of $1.0 \times 10^4$ to $1.0 \times 10^9$ Pa.

8. An optical semiconductor device comprising an optical semiconductor element encapsulated with the resin according to item 1.

9. The optical semiconductor device according to item 8, which has a luminance retention of 70% or higher.

According to the present invention, it is possible to obtain a resin for optical-semiconductor-element encapsulation which suffers no discoloration when used at a high temperature, has a satisfactory light transmittance, and has a satisfactory storage modulus, i.e., has flexibility which makes the resin producible by a roll-to-roll process. Furthermore, it is also possible to obtain an optical semiconductor device which includes an optical semiconductor element encapsulated with the resin and has a satisfactory luminance retention.

The resin for optical-semiconductor-element encapsulation of the invention is suitable for use in, e.g., backlights for liquid-crystal screens, traffic signals, large outdoor displays, advertising signboards, etc.

DETAILED DESCRIPTION OF THE INVENTION

The resin for optical-semiconductor-element encapsulation of the invention is a resin obtained by reacting a silicon compound with a boron compound or an aluminum compound, in which the silicon compound is represented by following formula (I).

The silicon compound is a compound represented by the following formula (I):

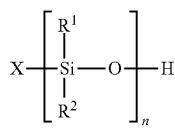

(I)

wherein $R^1$ and $R^2$ each independently represent an alkyl group, a cycloalkyl group, an alkenyl group, an alkynyl group, or an aryl group, in which a plurality of $R^1$'s are the same or different and a plurality of $R^2$'s are the same or different; X represents a hydroxy group, an alkoxy group, an alkyl group, a cycloalkyl group, an alkenyl group, an alkynyl group, or an aryl group; and n is 4 to 250.

In the formula (I), $R^1$ and $R^2$ each independently represent an alkyl group, cycloalkyl group, alkenyl group, alkynyl group, or aryl group. The number of carbon atoms of each of these groups is preferably 1-18, more preferably 1-12, and even more preferably 1-6, from the standpoints of reactivity, stability, and profitability. Examples thereof include alkyl groups such as methyl, ethyl, propyl, and isopropyl; cycloalkyl groups such as cyclopentyl and cyclohexyl; alkenyl groups such as vinyl and allyl; alkynyl groups such as ethynyl and propynyl; and aryl groups such as phenyl and tolyl. It is especially preferred that $R^1$ and $R^2$ each independently are methyl.

In the formula (I), X represents a hydroxy group, alkoxy group, alkyl group, cycloalkyl group, alkenyl group, alkynyl group, or aryl group. The number of carbon atoms of each of these groups is preferably 1-18, more preferably 1-12, and even more preferably 1-6, from the standpoints of reactivity, stability, and profitability. Examples thereof include a hydroxy group; alkoxy groups such as methoxy and ethoxy; alkyl groups such as methyl, ethyl, propyl, and isopropyl; cycloalkyl groups such as cyclopentyl and cyclohexyl; alkenyl groups such as vinyl and allyl; alkynyl groups such as ethynyl and propynyl; and aryl groups such as phenyl and tolyl. It is especially preferred that X is a hydroxy group.

In the formula (I), symbol n is a number of 4-250 on the average, and is preferably 4-200, and more preferably 4-160, from the standpoint of the heat resistance and flexibility of the reaction product.

Examples of the silicon compound represented by the formula (I) include polydimethylsiloxane terminated by a silanol group at each end, polydiphenylsiloxane terminated by a silanol group at each end, polydimethylsiloxane terminated by a silanol group at one end, polydiphenylsiloxane terminated by a silanol group at one end, and polymethylphenylsiloxane terminated by a silanol group at each end. Such silicon compounds may be used alone or in combination of two or more thereof. Preferred of these is polydimethylsiloxane terminated by a silanol group at each end, in which $R^1$ and $R^2$ each are methyl and X is hydroxy.

The number-average molecular weight of the silicon compound represented by the formula (I) is preferably 300-20,000, more preferably 300-15,000, and even more preferably 300-12,000, from the standpoint of the heat resistance and flexibility of the reaction product. Number-average molecular weight can be determined by NMR spectroscopy or GPC.

In preparing the encapsulating resin of the invention, one or more silicon compounds other than the silicon compound represented by the formula (I) may also be used so long as this does not lessen the effects of the invention. However, the amount of the silicon compound represented by the formula (I) to be used is preferably 30-99% by weight, more preferably 50-99% by weight, and even more preferably 60-99% by weight, of the mixture to be subjected to the reaction, from the standpoints of heat resistance, transparency, and light resistance.

The boron compound preferably is a compound represented by the following formula (II):

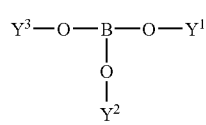

(II)

wherein $Y^1$, $Y^2$, and $Y^3$ each independently represent hydrogen or an alkyl group.

The number of carbon atoms of the alkyl group in the formula (II) is preferably 1-12, more preferably 1-6, and even more preferably 1-3. Examples of the alkyl group include methyl, ethyl, propyl, and isopropyl. Preferred of these are ethyl and isopropyl, and isopropyl is more preferred.

Examples of the compound represented by the formula (II) include boric acid, trimethyl borate, triethyl borate, and triisopropyl borate. Such compounds may be used alone or in combination of two or more thereof. Preferred of these are boric acid, triethyl borate, and triisopropyl borate, and triisopropyl borate is more preferred.

The weight ratio between the silicon compound and boron compound to be reacted (silicon compound/boron compound) is preferably from 95/5 to 30/70, more preferably from 95/5 to 50/50, even more preferably from 95/5 to 60/40, and most preferably from 95/5 to 70/30, from the standpoints of heat resistance, transparency, and light resistance.

The aluminum compound preferably is a compound represented by the following formula (III):

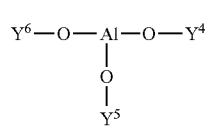

(III)

wherein $Y^4$, $Y^5$, and $Y^6$ each independently represent hydrogen or an alkyl group.

The number of carbon atoms of the alkyl group in the formula (III) is preferably 1-12, more preferably 1-6, and even more preferably 1-3. Examples of the alkyl group include methyl, ethyl, propyl, and isopropyl. Preferred of these are ethyl and isopropyl, and isopropyl is more preferred.

Examples of the aluminum compound represented by the formula (III) include aluminum methoxide, aluminum ethoxide, aluminum propoxide, and aluminum butoxide. Such compounds may be used alone or in combination of two or more thereof. Preferred of these is aluminum triisopropoxide.

The weight ratio between the silicon compound and aluminum compound to be reacted (silicon compound/aluminum compound) is preferably from 99/1 to 30/70.

In a reaction mixture, the ratio of the silicon atoms in the silicon compound to the boron atoms in the boron compound or the aluminum atoms in the aluminum compound (Si/B or Si/Al ratio) is preferably from 2/1 to 1,000/1, more preferably from 4/1 to 500/1, and even more preferably from 6/1 to 200/1. In case where the amount of the silicon atoms is smaller than the lower limit of this range, a rigid resin tends to be obtained. In case where the amount of the silicon atoms is larger than the upper limit of this range, a resin tends to be too flexible, whereby it is difficult to be formed into a sheet.

The reaction of the silicon compound with the boron compound or aluminum compound can be conducted, for example, at a temperature of 0-100° C. for 1-48 hours with stirring in the absence of a solvent.

The resin for optical-semiconductor-element encapsulation thus obtained may be applied to a glass plate or the like, dried, and then heated at preferably 50-300° C., and more preferably 100-250° C., for a period of preferably from 30 minutes to 48 hours, and more preferably 2-24 hours, to thereby obtain a resin sheet for optical-semiconductor-element encapsulation which contains a polyborosiloxane or polyaluminosiloxane in a semi-cured state. The thickness of this sheet is preferably 50-5,000 μm, and more preferably 100-4,000 μm.

The transparency (light-transmittance at 450 nm) of the resin of the invention is preferably 90% or higher, and more preferably 95% or higher, from the standpoint of maintaining the luminance of the optical semiconductor device. In this specification, transparency (light transmittance at 450 nm) is measured by the method described in the Examples which will be given later.

From the standpoints of handleability and soldering resistance, the resin of the invention has a storage modulus of preferably from $1.0 \times 10^4$ to $1.0 \times 10^9$ Pa, and more preferably from $1.0 \times 10^4$ to $1.0 \times 10^7$ Pa. Storage modulus can be determined by examining a cured resin with a dynamic viscoelastometer (ARES, manufactured by TA Instruments).

The resin (sheet) can be used, for example, in the following manner. The resin is placed on a substrate having an LED element which is 1 mm square and further having a reflector with a height of 400 μm disposed so as to surround the element at a distance of 5 mm therefrom. This assemblage is pressed at a pressure of 0.5 MPa to encapsulate the optical semiconductor element.

The encapsulating resin of the invention is suitable for use as a resin for encapsulating an optical semiconductor element for use in backlights for liquid-crystal screens, traffic signals, large outdoor displays, advertising signboards, etc.

The invention further relates to an optical semiconductor device including an optical semiconductor element encapsulated with the resin for optical-semiconductor-element encapsulation.

The optical semiconductor device of the invention has a luminance retention of preferably 70% or higher, and more preferably 90% or higher, from the standpoint of securing durability. In this regard, luminance retention can be defined by the following equation.

luminance retention=[(luminance after 300-hour continuous lighting at 300 mA)/(luminance just after test initiation)]×100

Luminance can be measured by the method described in the Examples which will be given below.

EXAMPLES

Example 1

To 10.0 g (33.3 mmol) of a silicone oil terminated by a silanol group at each end (represented by the formula (I) wherein $R^1$ and $R^2$ were methyl, X was hydroxy, and n is 4; number-average molecular weight, 300) was added 4.22 g (22.4 mmol) of triisopropyl borate. This mixture was stirred at room temperature for 2 hours, and the resultant liquid resin was applied to a glass plate, dried, and heated at 150° C. for 30 minutes, whereby a resin sheet for optical-semiconductor-element encapsulation containing a polyborosiloxane in a semi-cured state was obtained.

The resin sheet for optical-semiconductor-element encapsulation thus obtained was placed on a substrate having a blue-light-emitting diode mounted thereon so that the blue-light-emitting diode was covered with the sheet. This assemblage was pressed with a die to cure the resin at 200° C. for 2 hours. Thus, the blue-light-emitting diode was encapsulated to obtain a blue-light-emitting diode device.

Example 2

A blue-light-emitting diode device was obtained in the same manner as in Example 1, except that a liquid resin was obtained by adding 1.25 g (6.65 mmol) of triisopropyl borate to 10.0 g (33.3 mmol) of a silicone oil terminated by a silanol group at each end (represented by the formula (I) wherein $R^1$ and $R^2$ were methyl, X was hydroxy, and n is 4; number-average molecular weight, 300) and stirring the resultant mixture at room temperature for 2 hours.

Example 3

A blue-light-emitting diode device was obtained in the same manner as in Example 1, except that a liquid resin was obtained by adding 1.25 g (6.65 mmol) of triisopropyl borate to 10.0 g (10.0 mmol) of a silicone oil terminated by a silanol group at each end (represented by the formula (I) wherein $R^1$ and $R^2$ were methyl, X was hydroxy, and n is 13; number-average molecular weight, 1,000) and stirring the resultant mixture at room temperature for 2 hours.

Example 4

A blue-light-emitting diode device was obtained in the same manner as in Example 1, except that a liquid resin was obtained by adding 6.97 g (34.2 mmol) of aluminum triisopropoxide to 129 g (129 mmol) of a silicone oil terminated by a silanol group at each end (represented by the formula (I) wherein $R^1$ and $R^2$ were methyl, X was hydroxy, and n is 13; number-average molecular weight, 1,000) and stirring the resultant mixture at room temperature for 2 hours.

Example 5

A liquid resin was obtained by adding 2.18 g (10.7 mmol) of aluminum triisopropoxide to 40.0 g (133 mmol) of a silicone oil terminated by a silanol group at each end (represented by formula (I) wherein $R^1$ and $R^2$ were methyl, X was hydroxy, and n is 4; number-average molecular weight, 300) and stirring the resultant mixture at room temperature for 2 hours.

A blue-light-emitting diode device was obtained in the same manner as in Example 1, except that the liquid resin obtained was applied to a glass plate, dried, and heated at 150° C. for 1 hour to obtain a resin sheet for optical-semiconductor-element encapsulation containing a polyaluminosiloxane in a semi-cured state.

Example 6

A liquid resin was obtained by adding 2.26 g (11.1 mmol) of aluminum triisopropoxide to 41.1 g (13.7 mmol) of a silicone oil terminated by a silanol group at each end (represented by the formula (I) wherein $R^1$ and $R^2$ were methyl, X was hydroxy, and n is 40; number-average molecular weight, 3,000) and stirring the resultant mixture at room temperature for 2 hours.

A blue-light-emitting diode device was obtained in the same manner as in Example 1, except that the liquid resin obtained was applied to a glass plate, dried, and heated at 200° C. for 30 minutes to obtain a resin sheet for optical-semiconductor-element encapsulation containing a polyaluminosiloxane in a semi-cured state.

Example 7

A blue-light-emitting diode device was obtained in the same manner as in Example 6, except that a liquid resin was obtained by adding 1.30 g (6.37 mmol) of aluminum triisopropoxide to 48.2 g (48.2 mmol) of a silicone oil terminated by a silanol group at each end (represented by the formula (I) wherein $R^1$ and $R^2$ were methyl, X was hydroxy, and n is 13; number-average molecular weight, 1,000) and stirring the resultant mixture at room temperature for 2 hours.

Example 8

A blue-light-emitting diode device was obtained in the same manner as in Example 6, except that a liquid resin was obtained by adding 0.688 g (3.37 mmol) of aluminum triisopropoxide to 50.8 g (50.8 mmol) of a silicone oil terminated by a silanol group at each end (represented by the formula (I) wherein $R^1$ and $R^2$ were methyl, X was hydroxy, and n is 13; number-average molecular weight, 1,000), stirring the resultant mixture at room temperature for 2 hours, filtering the resultant suspension, and treating the filtrate with a rotary evaporator to remove volatile ingredients.

Example 9

A blue-light-emitting diode device was obtained in the same manner as in Example 6, except that a liquid resin was obtained by adding 0.690 g (3.38 mmol) of aluminum triisopropoxide to 50.0 g (4.35 mmol) of a silicone oil terminated by a silanol group at each end (represented by the formula (I) wherein $R^1$ and $R^2$ were methyl, X was hydroxy, and n is 155; number-average molecular weight, 11,500) and stirring the resultant mixture at room temperature for 2 hours.

Comparative Example 1

Forty-five parts by weight of a bisphenol A epoxy resin having an epoxy equivalent of 7,500 (Epikote EP1256, manufactured by Japan Epoxy Resins Co., Ltd.), 33 parts by weight of an epoxy resin having an alicyclic framework and having an epoxy equivalent of 260 (EHPE-3150, manufactured by Daicel Chemical Industries, Ltd.), 22 parts by weight of 4-methylhexahydrophthalic anhydride (MH-700, manufactured by New Japan Chemical Co., Ltd.), and 1.2 parts by weight of 2-methylimidazole (2MZ, manufactured by Shikoku Chemicals Corp.) were dissolved in methyl ethyl ketone in such amounts as to result in a concentration of 50%. Thus, a coating solution was produced. This solution was applied to a polyester film in such an amount as to result in a thickness of 100 μm, and then dried at 130° C. for 2 minutes. Three sheets of this epoxy resin coating were thermally laminated together at 100° C. while suitably stripping off the polyester film to thereby produce an epoxy resin sheet having a thickness of 300 μm.

A substrate having a blue-light-emitting diode mounted thereon was heated to 150° C. Thereafter, the epoxy resin sheet obtained was placed on the substrate so that the blue-light-emitting diode was covered with the sheet. The blue-light-emitting diode was encapsulated at a pressure of 0.5 MPa to obtain a blue-light-emitting diode device.

The resin sheets and devices obtained above were respectively examined according to the following evaluation items. The results obtained are shown in Tables 1 and 2.

(Light Transmittance)

The resin sheets obtained in the Examples and Comparative Example were examined with a spectrophotometer (U-4100, manufactured by Hitachi High-Technologies Corp.) for light transmittance (converted to a value corresponding to a sheet thickness of 100 μm) at a wavelength of 450 nm.

(Heat Resistance)

The resin sheets obtained in the Examples and Comparative Example were allowed to stand in a 150° C. hot-air drying oven for 100 hours. The resins which had undergone the 100-hour standing were visually examined for transparency. The resins which suffered no color change from the original state are indicated by "good", and the resin which changed in color from the original state is indicated by "poor".

(Storage Modulus)

The resin sheets obtained in the Examples and Comparative Example were examined for storage modulus with a dynamic viscoelastometer (ARES, manufactured by TA Instruments).

(Luminance Retention)

A current of 300 mA was caused to flow through each of the blue-light-emitting diode devices obtained in the Examples and Comparative Example, and the luminance of the device immediately after initiation of the test was measured with an MCPD (momentary multi-channel photodetector system MCPD-3000, manufactured by Otsuka Electronics Co., Ltd.). Thereafter, each device was allowed to stand, with the current flowing therethrough. After 300 hours, the luminance of this device was measured in the same manner. The luminance retention was calculated using the following equation. The diode devices having a luminance retention of 70% or higher were judged to have satisfactory light resistance.

Luminance retention (%)=[(luminance after 300-hour continuous lighting at 300 mA)/(luminance just after test initiation)]×100

TABLE 1

|  | Example 1 | Example 2 | Example 3 | Example 4 | Example 5 |
|---|---|---|---|---|---|
| Resin | polyborosiloxane | polyborosiloxane | polyborosiloxane | polyaluminosiloxane | polyaluminosiloxane |
| Number-average molecular weight (n) | 300 (4) | 300 (4) | 1,000 (13) | 1,000 (13) | 300 (4) |
| Si/B or Si/Al ratio | 6/1 | 20/1 | 20/1 | 50/1 | 50/1 |
| Light transmittance (%) | 100 | 100 | 100 | 100 | 100 |
| Heat resistance | good | good | good | good | Good |
| Storage modulus (Pa) | $1.28 \times 10^6$ | $1.31 \times 10^6$ | $7.65 \times 10^5$ | $1.78 \times 10^5$ | $1.09 \times 10^5$ |
| Luminance retention (%) | 99 | 100 | 100 | 99 | 100 |

TABLE 2

|  | Example 6 | Example 7 | Example 8 | Example 9 | Comparative Example 1 |
|---|---|---|---|---|---|
| Resin | polyaluminosiloxane | polyaluminosiloxane | polyaluminosiloxane | polyaluminosiloxane | epoxy resin |
| Number-average molecular weight (n) | 3,000 (40) | 1,000 (13) | 1,000 (13) | 11,500 (155) | — |
| Si/B or Si/Al ratio | 50/1 | 100/1 | 200/1 | 200/1 | — |
| Light transmittance (%) | 100 | 100 | 100 | 100 | 95 |
| Heat resistance | good | good | good | good | poor |
| Storage modulus (Pa) | $1.08 \times 10^5$ | $1.13 \times 10^5$ | $0.82 \times 10^5$ | $1.34 \times 10^5$ | $\geq 1 \times 10^9$ |
| Luminance retention (%) | 99 | 100 | 100 | 100 | 40 |

It can be seen from the results given in Table 1 and Table 2 that the resins for optical-semiconductor-element encapsulation according to the invention suffer no discoloration when used at a high temperature, have a satisfactory light transmittance, and have a satisfactory storage modulus, i.e., have flexibility which makes the resins producible by a roll-to-roll process. Furthermore, the optical semiconductor devices obtained by encapsulating an optical semiconductor element with these resins have a satisfactory luminance retention.

While the present invention has been described in detail and with reference to specific embodiments thereof, it will be apparent to one skilled in the art that various changes and modifications can be made therein without departing from the scope thereof.

This application is based on Japanese patent application No. 2007-306817 filed Nov. 28, 2007, the entire contents thereof being hereby incorporated by reference.

Further, all references cited herein are incorporated in their entireties.

What is claimed is:

1. An optical semiconductor device comprising an optical semiconductor element encapsulated with a resin for optical-semiconductor-element encapsulation obtained by reacting a silicon compound with a boron compound or an aluminum compound, wherein the silicon compound is represented by the following formula (I):

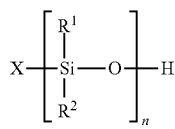

(I)

wherein $R^1$ and $R^2$ each independently represent an alkyl group, a cycloalkyl group, an alkenyl group, an alkynyl group, or an aryl group, in which a plurality of $R^1$'s are the same or different and a plurality of $R^2$'s are the same or different; X represents a hydroxy group, an alkoxy group, an alkyl group, a cycloalkyl group, an alkenyl group, an alkynyl group, or an aryl group; and n is 4 to 250.

2. The optical semiconductor device according to claim 1, wherein the boron compound is represented by the following formula (II):

wherein $Y^1$, $Y^2$, and $Y^3$ each independently represent hydrogen or an alkyl group.

3. The optical semiconductor device according to claim 1, wherein the aluminum compound is represented by the following formula (III):

wherein $Y^4$, $Y^5$, and $Y^6$ each independently represent hydrogen or an alkyl group.

4. The optical semiconductor device according to claim 1, wherein $R^1$ and $R^2$ each are methyl and X is hydroxy.

5. The optical semiconductor device according to claim 2, wherein the boron compound is triisopropyl borate.

6. The optical semiconductor device according to claim 3, wherein the aluminum compound is aluminum triisopropoxide.

7. The optical semiconductor device according to claim 1, which has a storage modulus of $1.0 \times 10^4$ to $1.0 \times 10^9$ Pa.

8. The optical semiconductor device according to claim 1, which has a luminance retention of 70% or higher.

9. The optical semiconductor device according to claim 1, where a weight ratio between the silicon compound and the boron compound is 95/5 to 30/70.

10. The optical semiconductor device according to claim 1, wherein a weight ratio between the silicon compound and the aluminum compound is 99/1 to 30/70.

* * * * *